(12) United States Patent
Divakaruni et al.

(10) Patent No.: US 6,831,006 B2
(45) Date of Patent: Dec. 14, 2004

(54) STRUCTURE AND METHOD FOR ELIMINATING METAL CONTACT TO P-WELL OR N-WELL SHORTS OR HIGH LEAKAGE PATHS USING POLYSILICON LINER

(75) Inventors: Ramachandra Divakaruni, Ossining, NY (US); Jack Mandelman, Flatrock, NC (US); Haining Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 19 days.

(21) Appl. No.: 10/345,468

(22) Filed: Jan. 15, 2003

(65) Prior Publication Data

US 2004/0137722 A1 Jul. 15, 2004

(51) Int. Cl.$^7$ .......................................... H01L 21/4763
(52) U.S. Cl. ........................ 438/639; 438/637; 438/622; 438/618; 257/773
(58) Field of Search ................................ 438/618, 622, 438/637, 658, 639; 257/773, 774

(56) References Cited

U.S. PATENT DOCUMENTS

| | | | |
|---|---|---|---|
| 5,293,053 A | * 3/1994 | Malhi et al. | ................. 257/330 |
| 6,339,241 B1 | 1/2002 | Mandelman et al. | |
| 6,399,447 B1 | 6/2002 | Clevenger et al. | |
| 6,753,241 B2 | * 6/2004 | Dennison | .................... 438/586 |
| 2002/0093112 A1 | 7/2002 | Nesbit et al. | |

* cited by examiner

Primary Examiner—Richard Elms
Assistant Examiner—Brad Smith
(74) Attorney, Agent, or Firm—Scully, Scott, Murphy & Presser; Joseph P. Abate, Esq.

(57) ABSTRACT

A short or high leakage path from a metal contact to a P-well can occur when a contact via mask is misaligned with an active area mask, in combination with an overetch into the isolation oxide of an isolation trench which forms a divot in the isolation oxide, exposing the contact junction depletion region or even a P-well on the active area sidewall. This problem is prevented by using an N+ doped polysilicon liner, wherein an outdiffusion of N+ dopant from the poly liner forms an N+ halo extension in the active area silicon, providing a reverse biased junction between the metal contact stud and the P-well. The complementary structure and method of an N-well and P+ dopant are also disclosed.

20 Claims, 12 Drawing Sheets

Illustration of Bitline toP-well Shorting (INVENTION)

(INVENTION)

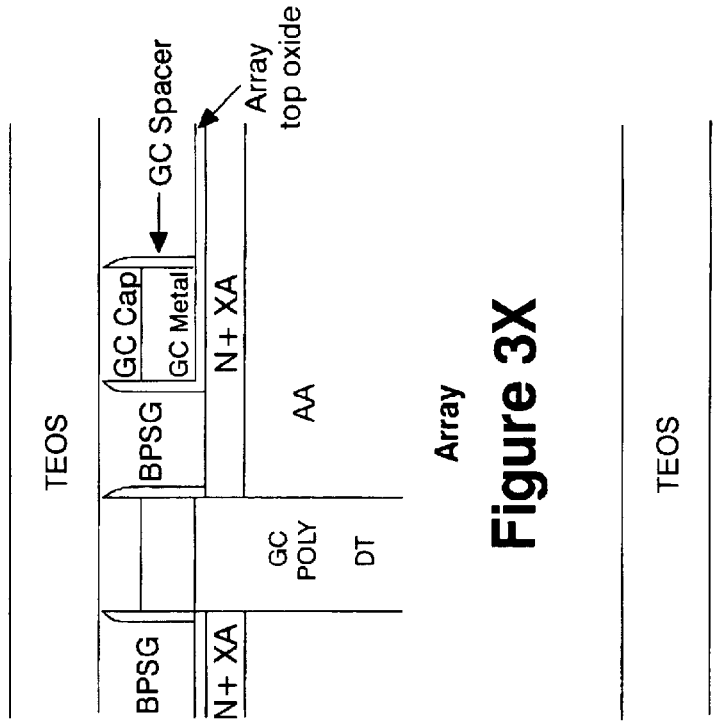
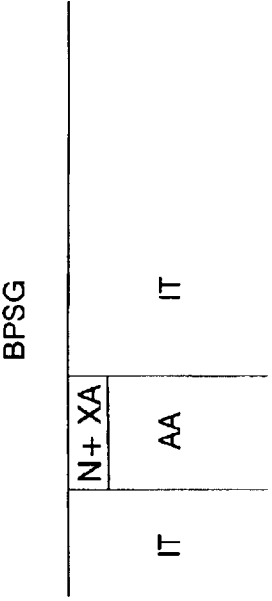
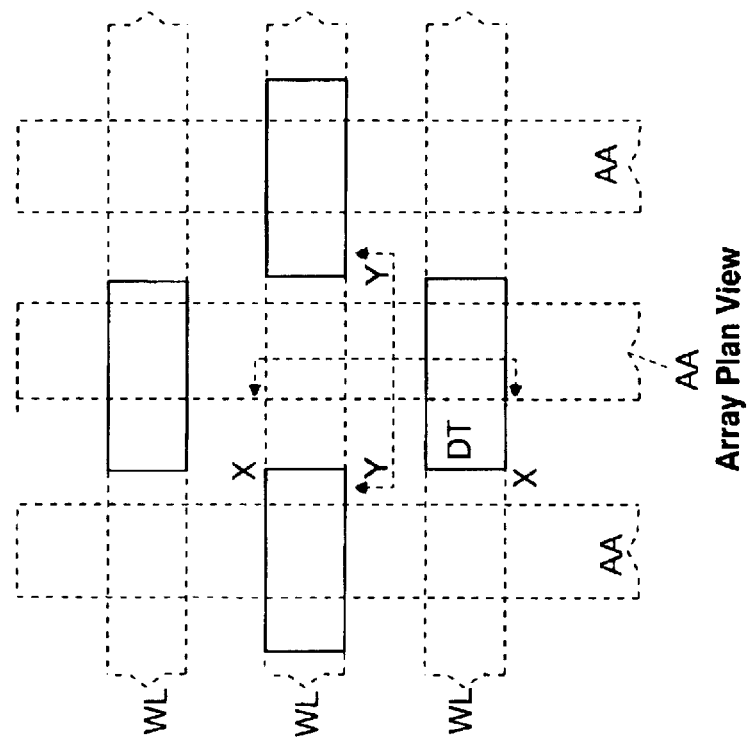
Figure 3X
Figure 3Y
Figure 3
Array Plan View Array Plan View

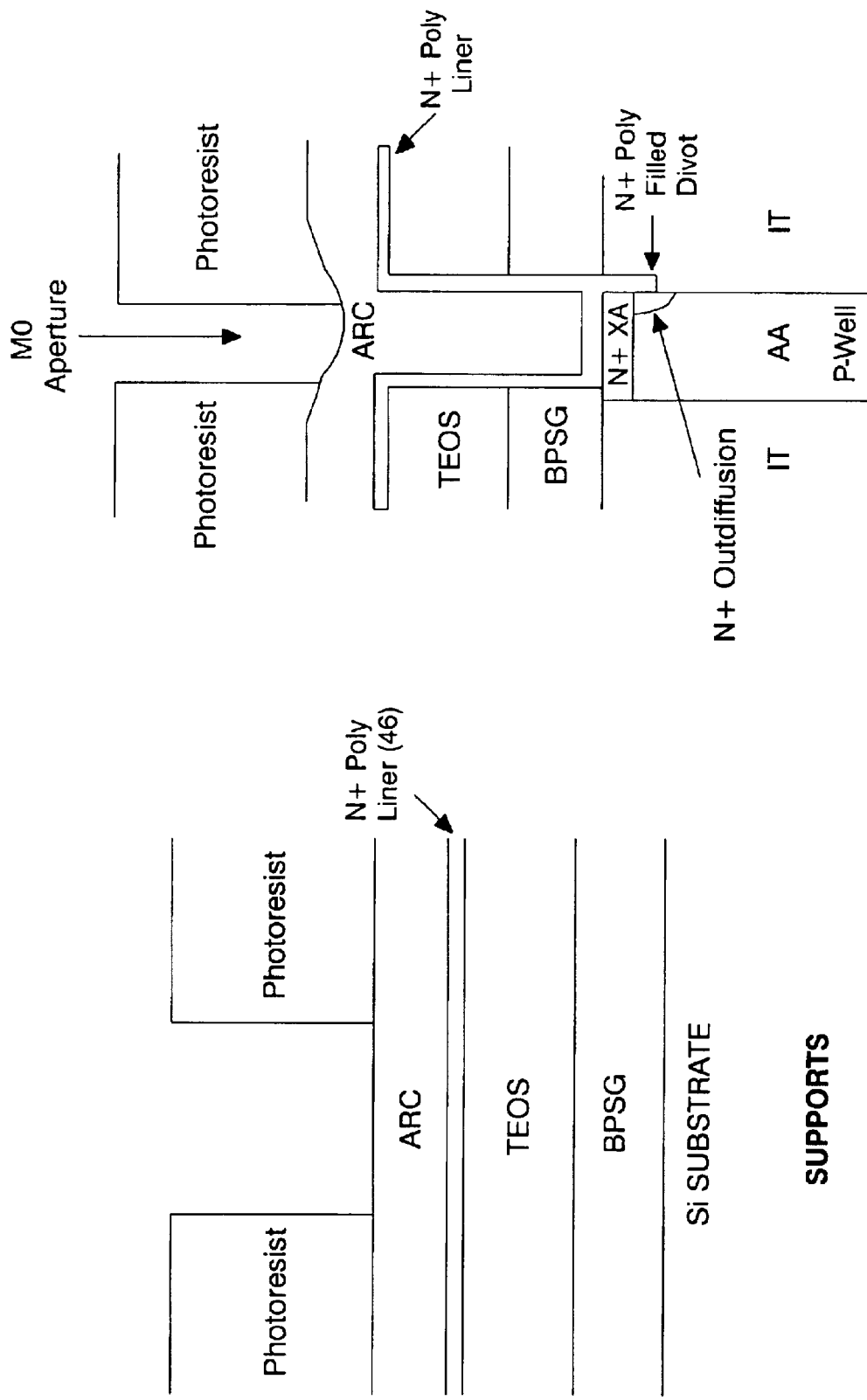

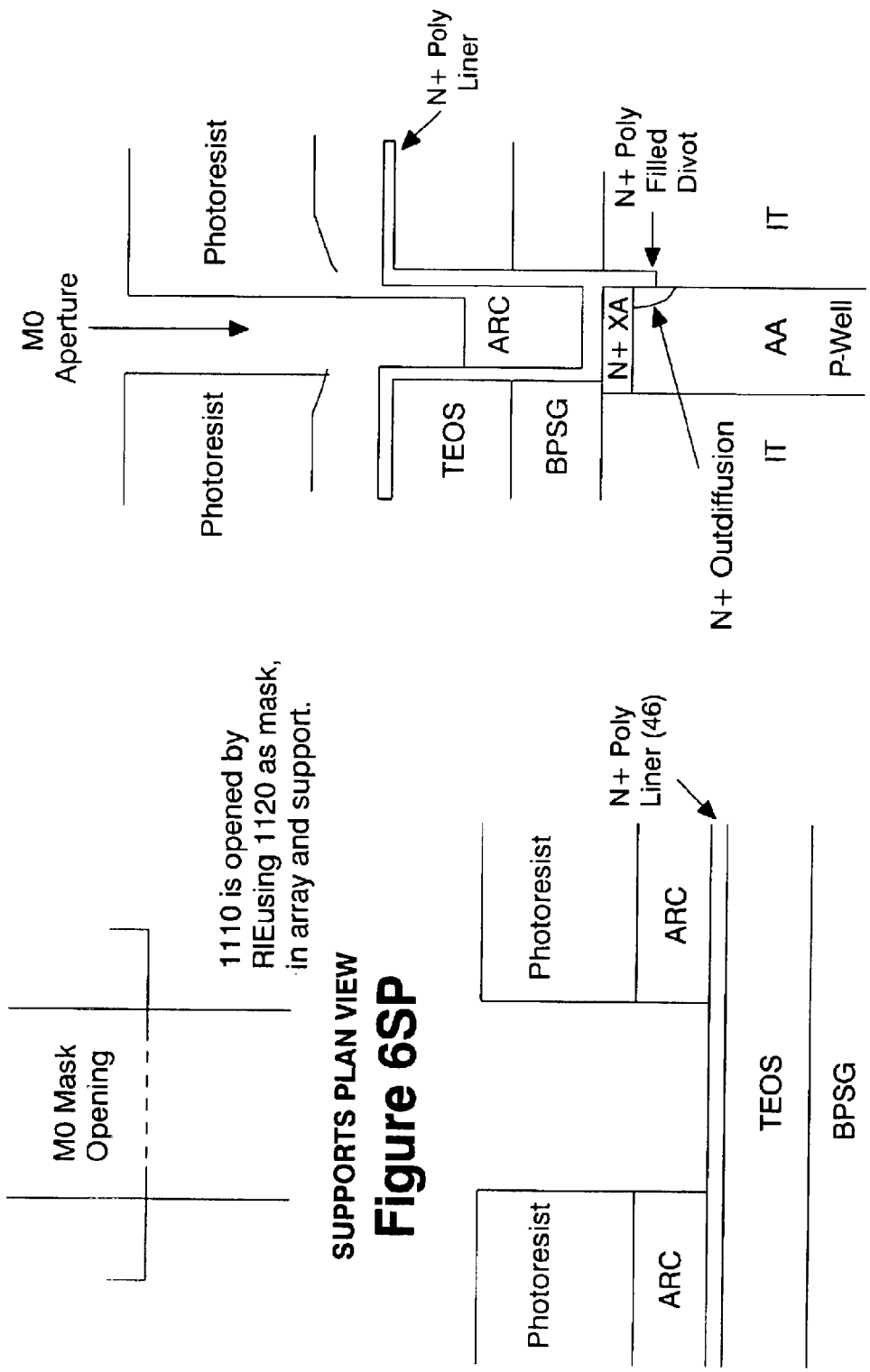

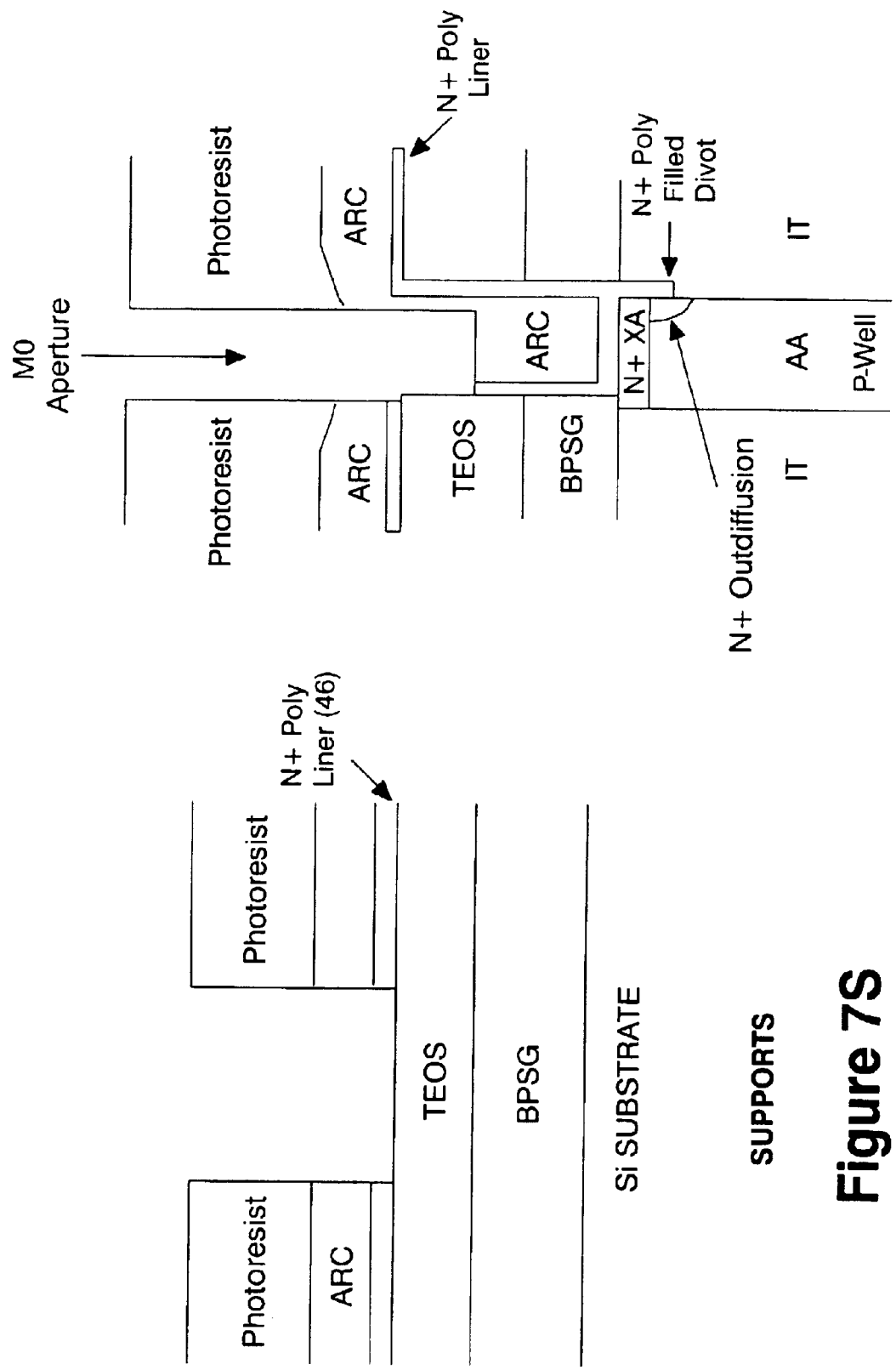

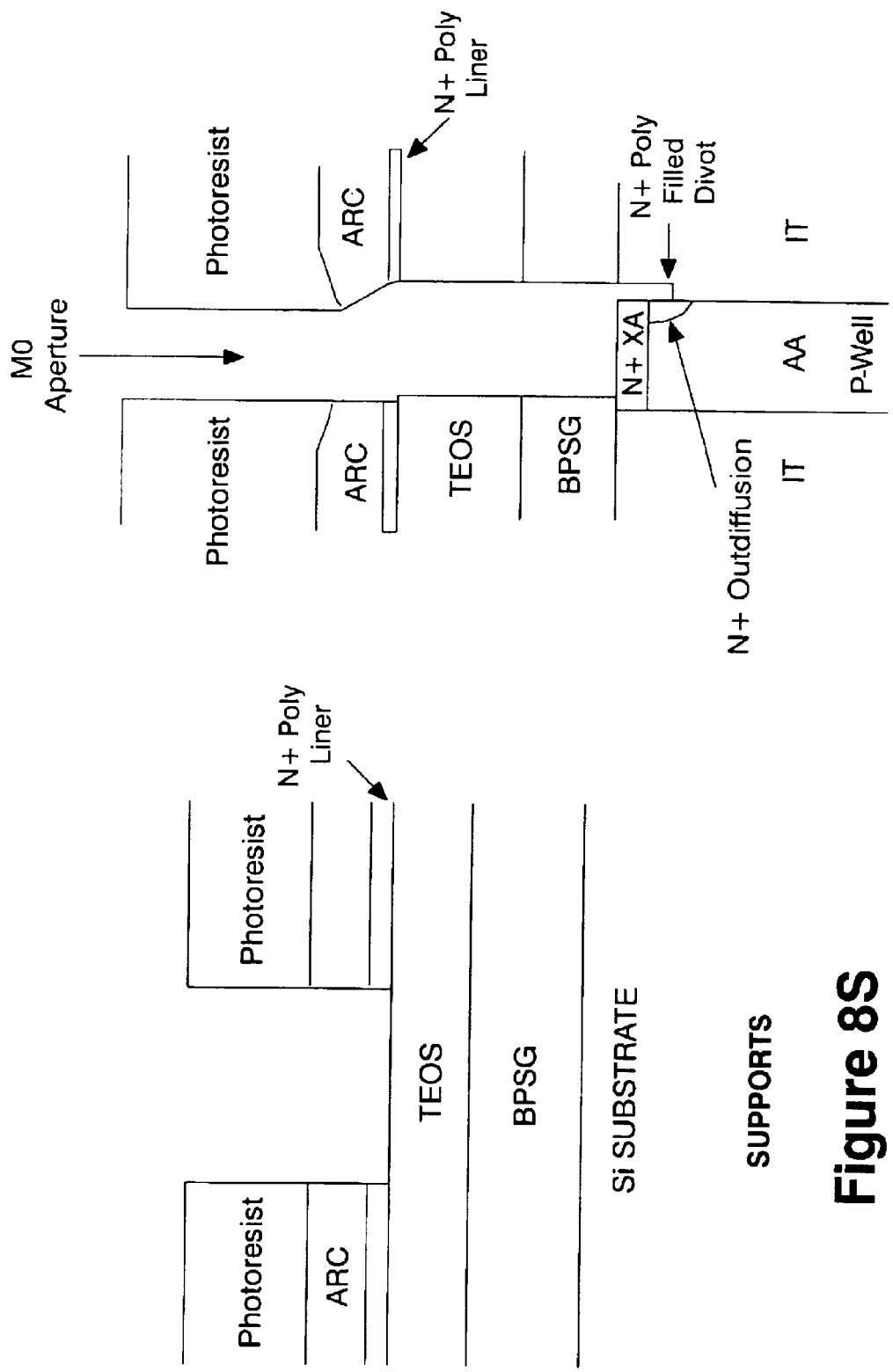

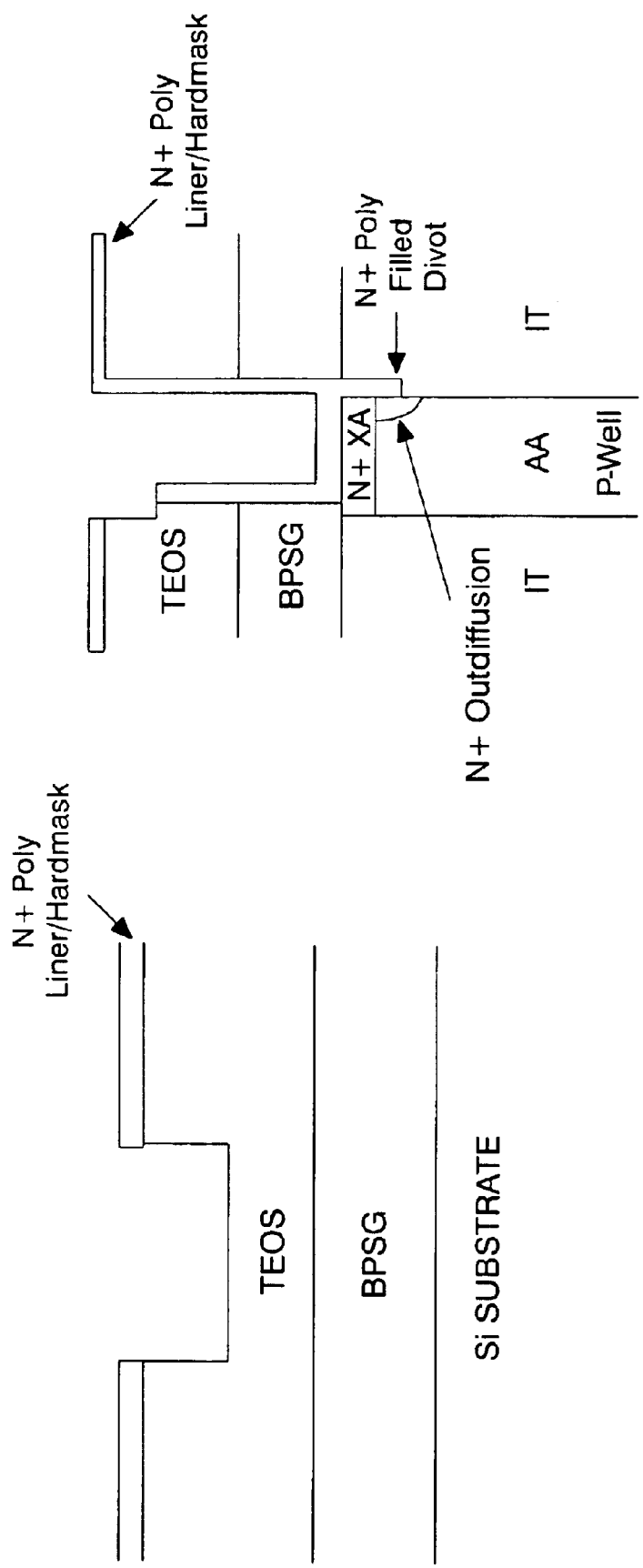

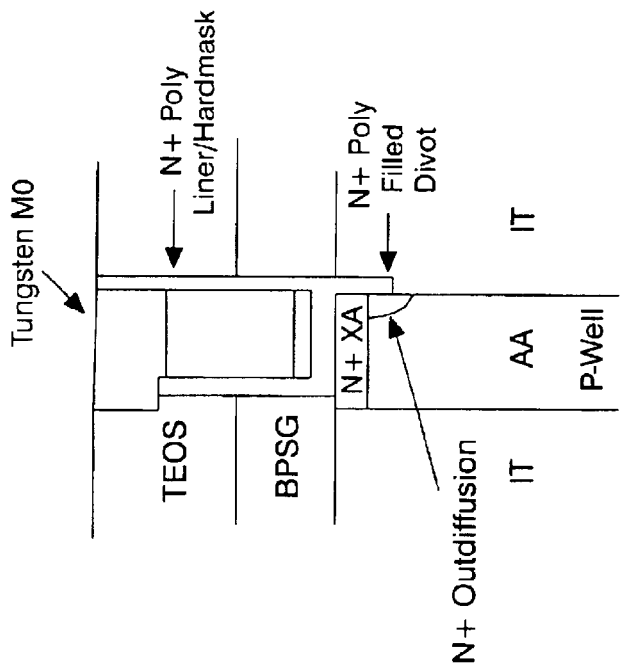
Figure 12Y
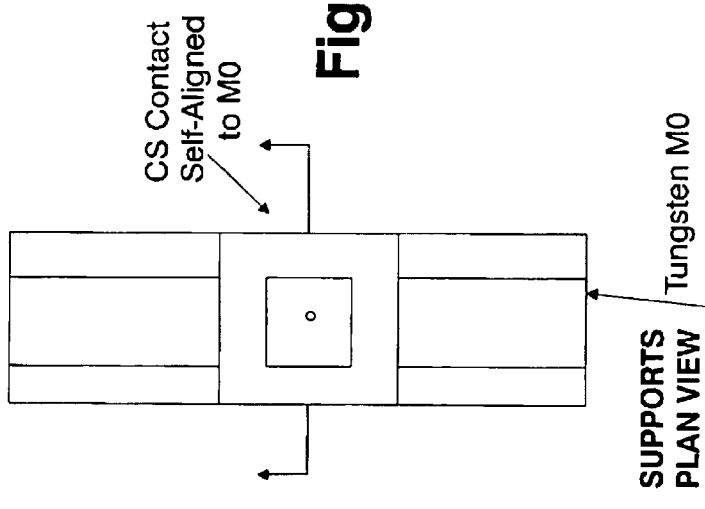
Figure 12SP
Figure 12S

STRUCTURE AND METHOD FOR ELIMINATING METAL CONTACT TO P-WELL OR N-WELL SHORTS OR HIGH LEAKAGE PATHS USING POLYSILICON LINER

BACKGROUND OF THE INVENTION

The present invention relates generally to a structure and method for eliminating metal contacts to P-well or N-well shorts when using metal studs, and more particularly eliminates metal contacts to P-well shorts when using metal contact studs by using an N+ doped polysilicon liner, wherein an outdiffusion of N+ dopant from the polysilicon forms an N+ halo extension in the active area silicon, providing a reverse biased junction between the metal contact stud and the P-well. The present invention also relates to the complementary structure and method of eliminating bitline diffusion to N-well shorts when using metal contact studs.

SUMMARY OF THE INVENTION

Accordingly, it is a primary object of the present invention to provide a structure and method for eliminating metal contacts to P-well or N-well shorts when using metal studs.

The present invention prevents a short from a metal stud to a P-well which can occur when a contact mask is misaligned with an active area (AA) mask, in combination with an overetch into the isolation oxide of an isolation trench which forms a divot in the isolation oxide, exposing the bitline junction depletion region or even a P-well on the active area mask sidewall to the metal stud. The present invention prevents this problem by using N+ doped polysilicon studs, wherein an outdiffusion of N+ dopant from the stud forms an N+ halo extension in the silicon, providing a reverse biased junction between the stud and the P-well. The present invention also relates to the complementary structure and method of eliminating metal contacts to N-well shorts when using metal studs.

In accordance with the teachings herein, the present invention provides the following advantages over the currently practiced, prior art technology:

it eliminates metal contacts to P-well or N-well shorts when using metal contact studs in a semiconductor device such as an embedded-DRAM or regular DRAM;

it provides contacts in a support which are self aligned to M0 metallurgy. This enables smaller support contacts and denser layouts;

it requires no additional masks or masking steps.

The present invention also provides a structure and method for eliminating metal contacts to N-well shorts when using metal studs. The present invention prevents a short from a metal stud to an N-well which can occur when a CB (contact bitline) contact mask is misaligned with an active area mask, in combination with an overetch into the isolation oxide of an isolation trench which forms a divot in the isolation oxide, exposing the bitline junction depletion region or even an N-well on the active area mask sidewall to the metal stud. The present invention prevents this problem by using P+ doped polysilicon studs, wherein an outdiffusion of P+ dopant from the stud forms a P+ halo extension in the silicon, providing a reverse biased junction between the stud and the N-well.

BRIEF DESCRIPTION OF THE DRAWINGS

The foregoing objects and advantages of the present invention may be more readily understood by one skilled in the art with reference being had to the following detailed description of several embodiments thereof, taken in conjunction with the accompanying drawings wherein like elements are designated by identical reference numerals throughout the several views, and in which:

FIG. 3 illustrates a plan view of a vertical transistor memory array which can be generally formed using known prior art process methods, and FIGS. 3X and 3Y are sectional views through the memory array of FIG. 3 taken along respective sectional arrows X-X and Y-Y.

FIGS. 5Y and 5S correspond to FIGS. 4Y and 4S, and illustrate the structure after the N+ poly liner is deposited, and an anti-reflecting coating ARC and photoresist are successively deposited on top of the N+ poly liner.

FIGS. 6Y and 6S correspond to FIGS. 5Y and 5S, while FIG. 6SP is a top plan view of FIG. 6S and illustrates the vertically extending line (conductor) of the first metal line mask opening, while FIGS. 6Y and 6S illustrate the structure after the ARC is opened by RIE (reactive ion etching) using the photoresist as a mask in both the array and supports regions of FIGS. 6Y and 6S.

FIGS. 7Y and 7S show the structure after the N+ poly liner is etched using the ARC and the photoresist as a mask by an RIE process in both the array and supports regions of FIGS. 7Y and 7S.

FIGS. 8Y and 8S illustrate an alternative process wherein the N+ poly liner is removed from the via sidewalls by an isotropic poly etch, however leaving the divot still filled with doped poly silicon.

FIGS. 10Y and 10S illustrate the structure after the first metal line mask pattern is formed by RIE using the patterned N+ poly liner as a protective hard mask.

FIGS. 12Y, 12S and 12SP illustrate the structure after the formation of the contact vias in the array and supports regions and the formation of the lines connecting the vias.

DETAILED DESCRIPTION OF THE INVENTION

The use of metal (e.g. tungsten) bitline contact studs is highly desirable for many semiconductor device technologies, such as DRAM technologies, particularly embedded-DRAM technologies, to reduce electrical resistance and to promote high speed charge transfer and signal development. However, a frequent occurrence of high junction leakage between metal contacts and P-wells has been observed when metal contact studs have been employed.

Figure 1:
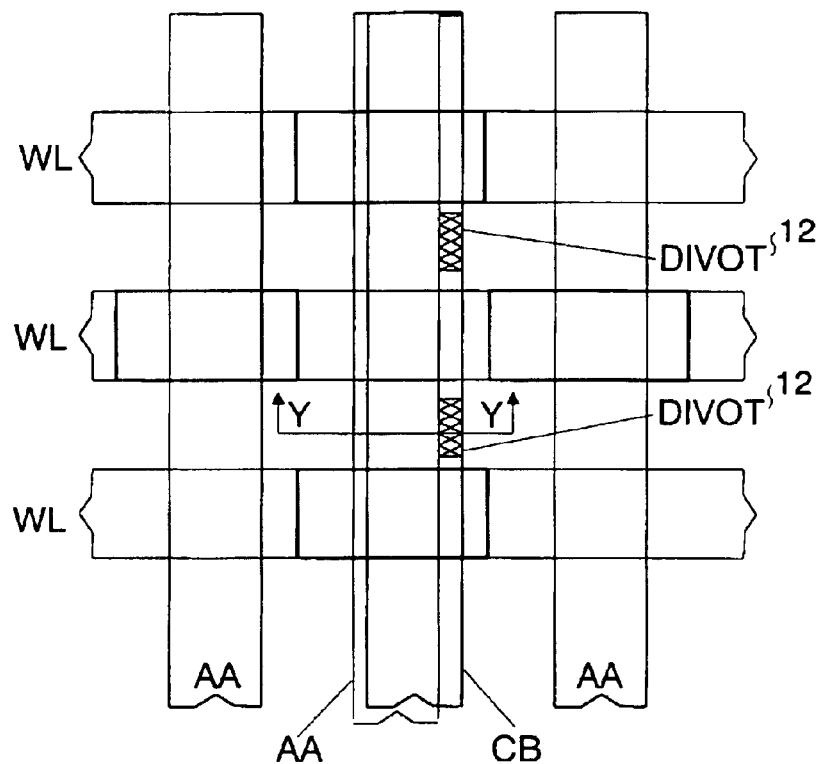
FIG. 1 illustrates a plan view of a prior art vertical transistor memory array.
Figure 1Y:
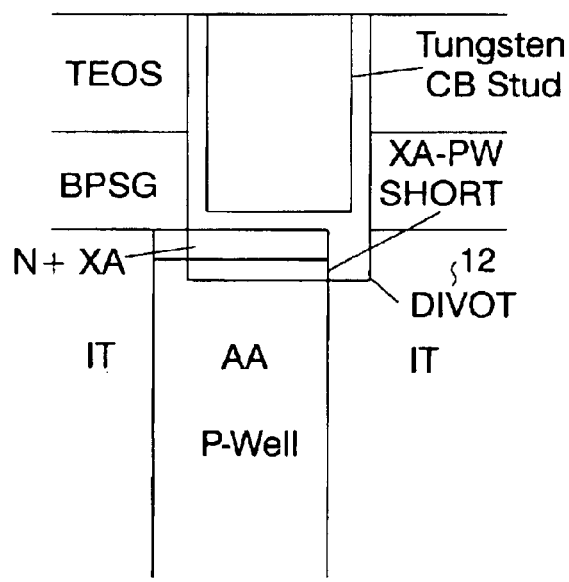
FIG. 1Y is a sectional view along sectional arrows Y-Y in FIG. 1, and FIGS. 1 and 1Y illustrate a problem with metal contacts to P-well shorting in the prior art.

FIG. 1 illustrates a plan view of a prior art vertical transistor memory array, and FIG. 1Y is a sectional view along sectional arrows Y-Y in FIG. 1, and FIGS. 1 and 1Y illustrate a problem with metal contacts to P-well shorting in the prior art. FIG. 1 illustrates a memory array having a plurality of horizontal wordlines WL, a plurality of vertical active areas AA (silicon), and a top poly DT. FIG. 1Y is a sectional view and shows a top layer of tetraethylorthosilicate (TEOS), a layer of boron phosphorous doped silicate glass (BPSG), a layer of heavily doped N+ XA above an active area AA of a P-well, isolation trenches IT formed of isolation oxide, and a tungsten CB stud in a bitline contact CB via which is misaligned to the right with respect to the AA P-well.

FIGS. 1 and 1Y show that a short from a metal contact to a P-well is created when a CB bitline contact mask is misaligned with an active area AA mask, in combination with an overetch into the isolation oxide of an isolation trench IT. The overetch forms a divot 12 in the isolation oxide, exposing the bitline junction depletion region or even a P-well on the active area AA mask sidewall to the metal bitline.

The present invention prevents this problem from occurring by using N+ doped polysilicon studs, since an outdiffusion of N+ dopant from the stud forms an N+ halo extension in the silicon, providing a reverse biased junction between the stud and the P-well.

Figure 2:
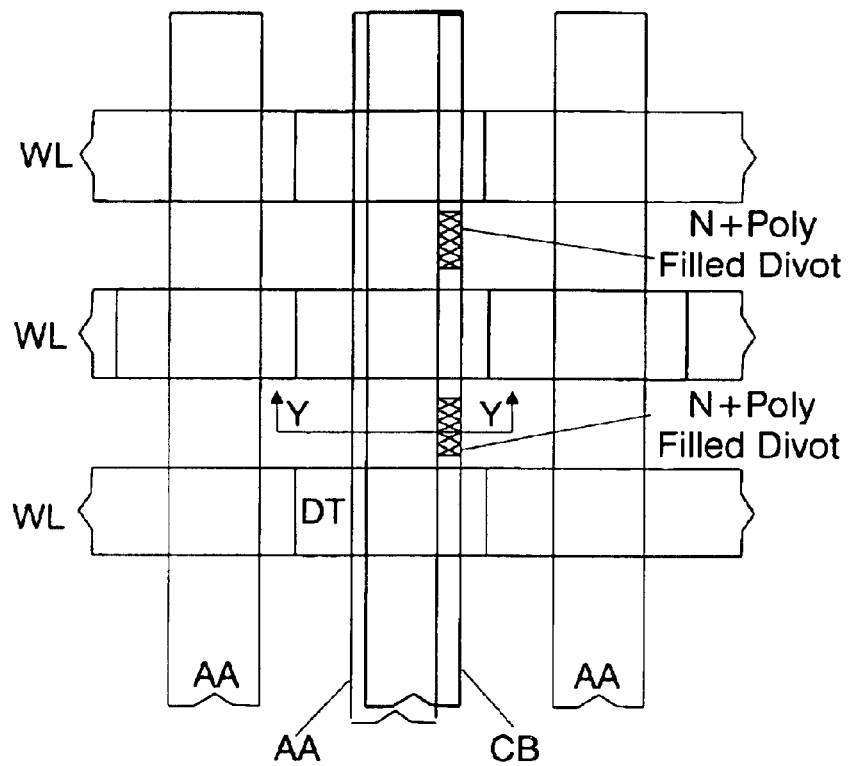
FIGS. 2 and 2Y are plan and sectional views of a memory array similar to FIG. 1 and 1Y, and illustrate that the present invention incorporates an N+ doped poly liner or layer in the CB (contact bitline) via.
Figure 2Y:
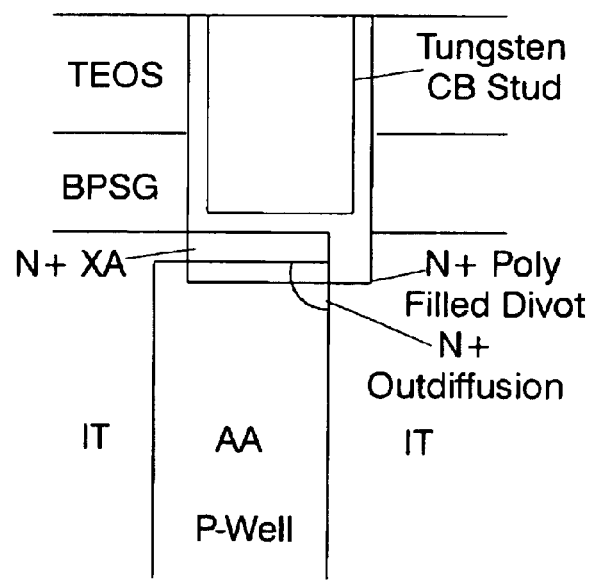

FIGS. 2 and 2Y are plan and sectional views of a memory array similar to FIG. 1 and 1Y, and illustrate that the present invention incorporates an N+ doped poly liner or layer in the CB via.

FIG. 2Y illustrates how the N+ doped poly liner fills the divot and forms a local N+ outdiffusion region. The poly liner does not have to completely fill the divot since the N+ doped poly liner also prevents the metal from contacting a sidewall of the active area.

A variation of this structure can remove the N+ doped poly liner from the walls of the CB via by using an isotropic etch, leaving N+ doped poly in the divot.

FIG. 3 illustrates a plan view of a vertical transistor memory array which can be generally formed using known prior art process methods, and FIGS. 3X and 3Y are sectional views through the memory array of FIG. 3 taken along respective sectional arrows X-X and Y-Y. FIGS. 3, 3X and 3Y illustrate a top layer of tetraethylorthosilicate (TEOS), a layer of boron phosphorous doped silicate glass (BPSG), a gate conductor (GC) Cap (e.g. silicon nitride), GC metal (e.g. tungsten), GC spacer (e.g. silicon nitride), GC poly DT, a layer of array top oxide, a layer of heavily doped N+ XA above an active area (AA) P-well, and isolation trenches (IT). FIG. 3X is illustrated only to show the structure of the vertical transistor array, and not to show the structure of the present invention.

In the following explanations of the Figures, unless otherwise noted, Figure n corresponds to a top plan view of the structure similar to FIG. 3 at different stages of the production process, Figure nY corresponds to a sectional view of the structure taken along sectional arrows Y-Y similar to FIG. 3Y at different stages of the production process, Figure nS corresponds to a sectional view of the supports (S) region on the peripheral area of the chip at different stages of the production process, and Figure nSP corresponds to a top plan (P) view of the supports (S) region at different stages of the production process.

Figure 4S:
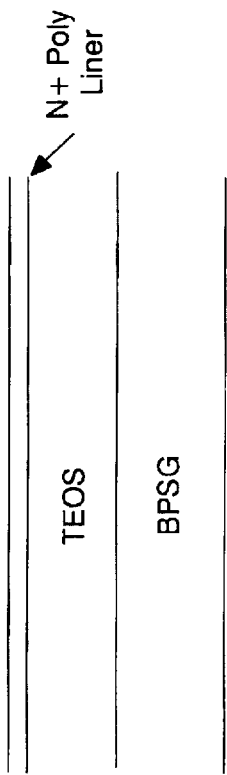
FIG. 4S is a sectional view of the supports region on the peripheral area of the chip at this stage of the process.
Figure 4Y:
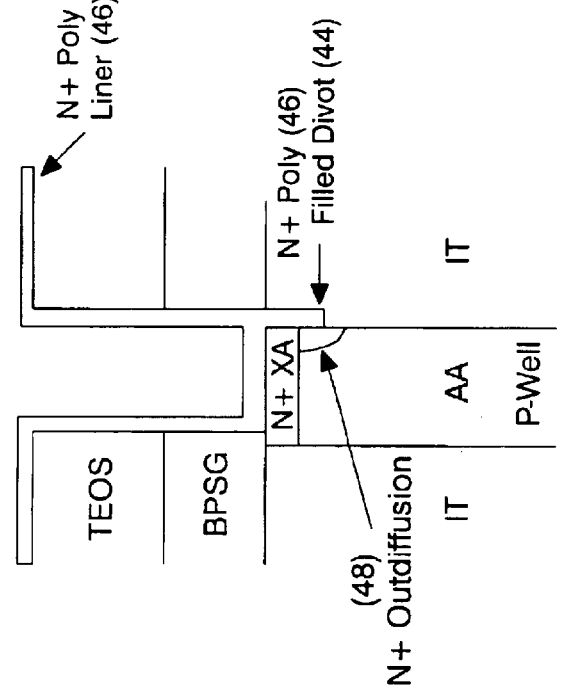
FIGS. 4 and 4Y correspond generally to FIGS. 3 and 3Y and illustrate the structure after a bitline contact via is etched in the DRAM/eDRAM array and is misaligned with the active area P-well.
Figure 4:
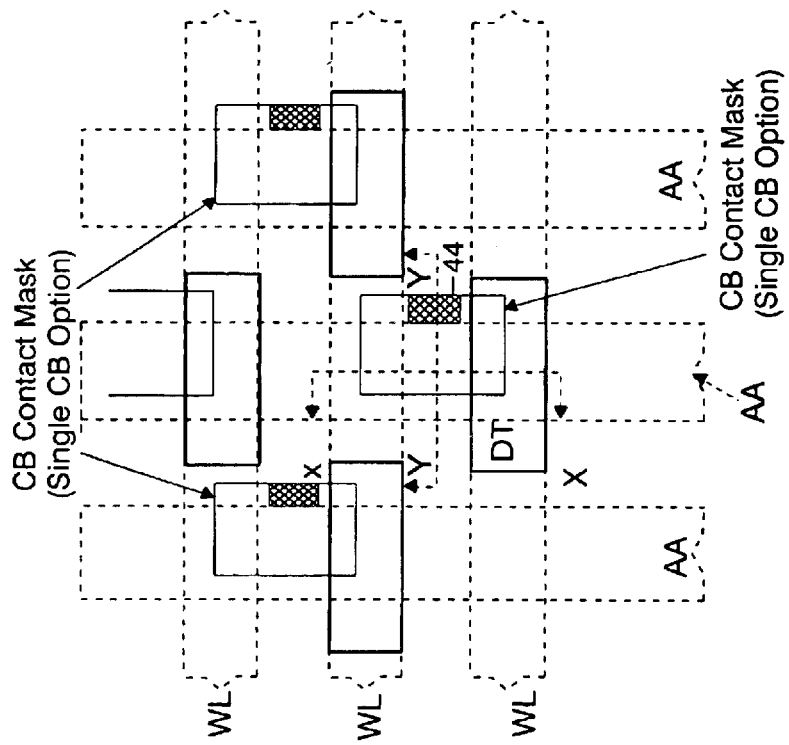

FIGS. 4 and 4Y correspond generally to FIGS. 3 and 3Y, and illustrate the structure after a bitline contact via 42 is etched in the DRAM/eDRAM array and is misaligned with the active area P-well. As a result of the misalignment, a divot 44 is formed on the side of the AA P-well after the contact via 42 is etched. The divot 44 is illustrated in the sectional view 4Y and shown as a shadowed region in the plan view of FIG. 4.

Pursuant to the present invention, after the contact via is etched, a layer or liner of N+ doped poly silicon 46 is deposited on the memory array and in the contact via and divot. As the wafer is annealed at elevated temperatures during the followed process steps, the dopant out-diffuses into the AA P-well, forming an N+ outdiffusion region 48. The interface of the N+ outdiffusion region 48 with the AA forms a reverse biased N-P junction which is self aligning to the interface of the bitline contact via and the AA, which prevents a short from the metal contact to the AA P-well.

FIG. 4S is a sectional view of the supports region on the peripheral area of the chip at this stage of the process, which is illustrated to demonstrate some of the advantages of the present invention as explained in greater detail hereinbelow.

FIGS. 5Y and 5S correspond to FIGS. 4Y and 4S, and illustrate the structure after an anti-reflective coating ARC and photoresist are successively deposited on top of the N+ poly liner. The first metal line mask (M0) pattern is then formed in the photoresist on the array region of FIG. 5Y and in the supports region of FIG. 5S, with the ARC preventing light from being reflected and protecting the underlying structure.

FIGS. 6Y and 6S correspond to FIGS. 5Y and 5S, while FIG. 6SP is a top plan view of FIG. 6S and illustrates the vertically extending line (conductor) of the M0 mask opening. FIGS. 6Y and 6S illustrate the structure after the M0 ARC is opened by RIE (reactive ion etching), using the M0 photoresist as a mask in both the array and supports regions of FIGS. 6Y and 6S.

FIGS. 7Y and 7S show the structure after the N+ poly liner is etched using the M0 ARC and the M0 photoresist as a mask by a RIE process in both the array and support regions of FIGS. 7Y and 7S.

FIGS. 8Y and 8S illustrate an alternative process wherein the N+ poly liner 36 is removed from the via sidewalls by an isotropic poly etch, however leaving the divot still filled with doped poly silicon, with the wider CB tungsten stud (because of the removed N+ poly liner) providing improved conductivity and lowered resistance. Moreover, the N+ poly liner can react with the CB tungsten to form tungsten silicide.

Figures 9S, 9Y:
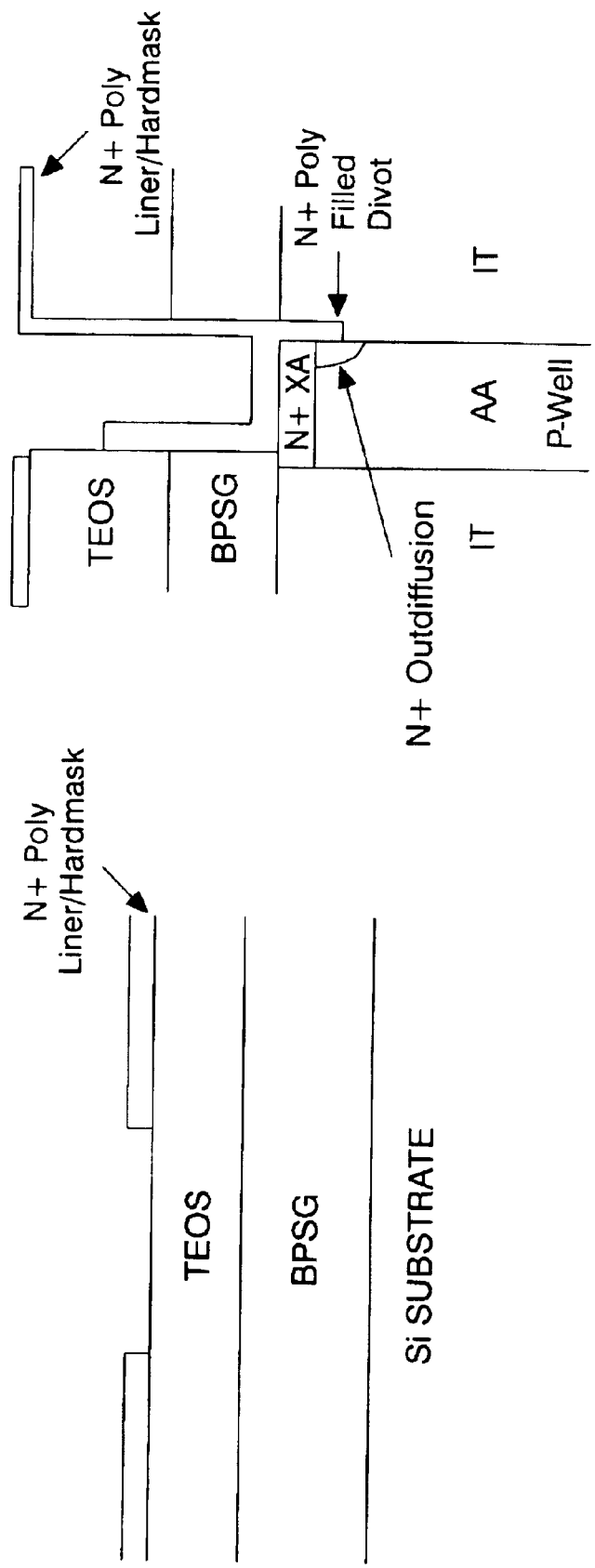
FIGS. 9Y and 9S illustrate the structure after the ARC and photoresist are stripped by ashing.

FIGS. 9Y and 9S illustrate the structure after the M0 ARC and M0 photoresist are stripped by ashing.

FIGS. 10Y and 10S illustrate the structure after the M0 pattern is formed by RIE using the patterned N+ poly liner as a protective hard mask. The RIE process is selective to the oxide etch. Note in FIG. 10S that the TEOS is only half etched in the supports area.

Figure 11S:
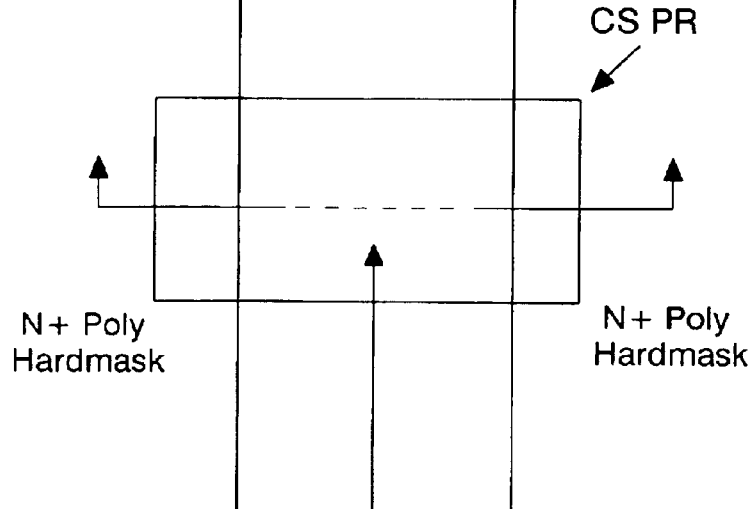
FIG. 11SP is a top plan view of the supports region similar to FIG. 6SP, and illustrates a vertically extending line opening (for a conductor) in the first metal line (M0) mask, and also illustrates a rectangular opening CS PR (contact to support photoresist) in a mask which is wider than the vertically extending line opening in the M0 mask, which compensates for any misalignment as shown in FIG. 11S.
Figure 11S:
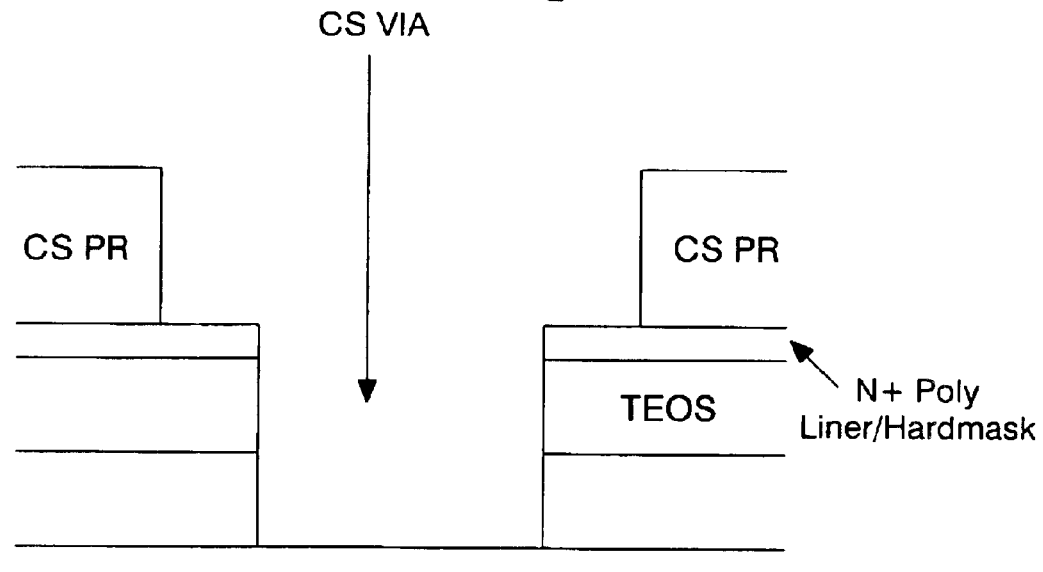

FIG. 11SP is a top plan view of the supports region similar to FIG. 6SP, and illustrates a vertically extending line opening (for a conductor) in the M0 mask. FIG. 11SP also illustrates a rectangular opening CS PR (contact to support photoresist) in a mask which is wider than the vertically extending line opening in the M0 mask, which compensates for any misalignment as shown in FIG. 11S. The contact via is patterned and etched in the supports region using known process methods. The array is masked using photoresist, and after the contact via is etched, the photoresist is stripped. The N+ poly liner functions as a hard mask which limits the contact via opening only within the M0 mask pattern. Accordingly, the contact via is thus self aligned to the M0 mask pattern, which allows denser patterning in the supports area. The CS via is thus aligned to the Si substrate.

FIGS. 12Y, 12S and 12SP illustrate the structure after the formation of the contact vias in the array and in the supports and the formation of the lines connecting the vias. In this process, Ti/TiN liner and W metal are deposited using known methods. The wafer is then CMPed (chemical mechanical polished) to remove excess W metal and Ti/TiN liner from the wafer surface (damascene process), leaving conducting metal in the lines, supports and array. The wafer is then processed for BEOL wirings using art known methods.

The present invention also provides a structure and method for eliminating metal contacts to N-well shorts when using metal studs. The present invention prevents a short from a metal stud to an N-well which an occur when a CB bitline contact mask is misaligned with an active area mask, in combination with an overetch into the isolation oxide of an isolation trench which forms a divot in the isolation oxide, exposing the bitline junction depletion region or even an N-well on the active area mask sidewall to the metal stud. The present invention prevents this problem by using P+ doped polysilicon studs, wherein an outdiffusion of P+ dopant from the stud forms a P+ halo extension in the silicon, providing a reverse biased junction between the stud and the N-well. The process steps, of this embodiment are complementary copies of the steps of FIGS. 2–12.

The same problem may be present, but has not yet been identified, in vertical MOSFETs. In vertical MOSFET arrays, the storage node diffusion is buried, enabling the use of metal bitline contacts with very low junction leakage. Accordingly, the present invention can possibly be used to improve on a process not even considered by the state of the art.

While several embodiments and variations of the present invention are described in detail herein, it should be apparent that the disclosure and teachings of the present invention will suggest many alternative designs to those skilled in the art.

Having thus described our invention, what we claim as new and desire to secure by Letters Patent is:

1. A method for preventing shorts from metal contacts to P-well active areas while using metal contact studs in a semiconductor device, comprising:
   depositing an N+ doped poly silicon liner on sidewalls of each metal contact;
   forming a local N+ outdiffusion region from the N+ doped poly silicon liner to form a reverse biased NP junction to the active area, self aligning to an interface between the metal contact and the active area to prevent a short or high leakage path between the metal contact and the active area.

2. The method of claim 1, wherein the step of forming includes annealing the semiconductor device such that N+ dopant from the N+ doped poly silicon liner out-diffuses into the P-well active area forming the N+ outdiffusion region.

3. The method of claim 1, wherein shorts or high leakage paths from metal contacts to P-well active areas can be created when a metal contact via is misaligned with an active area, such that a contact via is etched and is misaligned with the P-well active area and a divot is formed on the side of the P-well active area when the contact via is etched, further including removing the N+ doped poly liner from the sidewalls of the contact via by an etch, while leaving N+ doped poly in the divot, with the wider contact via produced by the removal of N+ poly liner from the sidewalls providing improved conductivity and lower resistance.

4. The method of claim 1, performed on a semiconductor device which comprises a DRAM.

5. The method of claim 4, wherein the N+ poly liner is deposited over the DRAM in both a memory array region of the DRAM and a supports region of the DRAM, an anti-reflecting coating ARC and photoresist are successively deposited on top of the N+ doped poly liner, a line mask pattern is formed in the photoresist on the memory array region of the DRAM and in the supports region of the DRAM.

6. The method of claim 5, wherein shorts from metal contacts to P-well active areas can be created when a metal contact via is misaligned with an active area, such that a contact via is etched and is misaligned with the P-well active area and a divot is formed on the side of the P-well active area when the contact via is etched, further including removing the N+ doped poly liner from the sidewalls of the contact via by an etch while using the ARC and the photoresist as a mask in both the memory array region and the supports region, while leaving N+ doped poly in the divot, with the wider contact via produced by the removal of N+ poly liner from the sidewalls providing improved conductivity and lower resistance.

7. The method of claim 6, wherein after the N+ poly liner is etched while using the ARC and the photoresist as a mask in both the memory array region and the supports region, the photoresist and the ARC are stripped, after which a line mask pattern is etched while using the N+ poly liner as a protective hard mask.

8. The method of claim 7, wherein the line mask pattern defines a line opening, and a contact to support photoresist opening in a mask in the DRAM supports region is wider than the line opening in the line mask, in which the line mask opening limits possible misalignment when the contact via is patterned and etched in the supports region because the N+ poly liner functions as a hard mask which limits the contact via opening to within the metal line mask pattern such that the contact via is self aligned to the metal line mask pattern.

9. A semiconductor device which uses metal contact studs while preventing shorts from metal contacts to P-well active areas, wherein each contact via for each metal contact has an adjacent N+ outdiffusion region forming a reverse biased NP junction to the active area which is self aligning to an interface between the contact via and the active area to prevent a short or high leakage path between the contact via and the active area.

10. The semiconductor device of claim 9, further including an N+ doped poly liner formed on sidewalls of each contact via.

11. A method for preventing shorts from metal contacts to N-well active areas while using metal contact studs in a semiconductor device, comprising:
   depositing a P+ doped poly silicon liner on sidewalls of each metal contact;
   forming a local P+ outdiffusion region from the P+ doped poly silicon liner to form a reverse biased PN junction to the active area, self aligning to an interface between the metal contact and the active area to prevent a short between the metal contact and the active area.

12. The method of claim 11, wherein the step of forming includes annealing the semiconductor device such that P+ dopant from the P+ doped poly silicon liner out-diffuses into the N-well active area forming the P+ outdiffusion region.

13. The method of claim 11, wherein shorts or high leakage paths from metal contacts to N-well active areas can be created when a metal contact via is misaligned with an active area, such that a contact via is etched and is misaligned with the N-well active area and a divot is formed on the side of the N-well active area when the contact via is etched, and further including removing the P+ doped poly liner from the sidewalls of the contact via by an etch, while leaving P+ doped poly in the divot, with the wider contact via produced by the removal of P+ poly liner from the sidewalls providing improved conductivity and lower resistance.

14. The method of claim 11, performed on a semiconductor device which comprises a DRAM.

15. The method of claim 14, wherein the P+ poly liner is deposited over the DRAM in both a memory array region of the DRAM and a supports region of the DRAM, an antireflecting coating ARC and photoresist are successively deposited on top of the P+ doped poly liner, a metal line mask pattern is formed in the photoresist on the memory array region of the DRAM and in the supports region of the DRAM.

16. The method of claim 15, wherein shorts from metal contacts to N-well active areas can be created when a metal contact via is misaligned with an active area, such that a contact via is etched and is misaligned with the N-well active area and a divot is formed on the side of the N-well active area when the contact via is etched, and further including removing the P+ doped poly liner from the sidewalls of the contact via by an etch while using the ARC and the photoresist as a mask in both the memory array region and the supports region, while leaving P+ doped poly in the divot, with the wider contact via produced by the removal of P+ poly liner from the sidewalls providing improved conductivity and lower resistance.

17. The method of claim 16, wherein after the P+ poly liner is etched while using the ARC and the photoresist as a mask in both the memory array region and the supports region, the photoresist and the ARC are stripped, after which a metal line mask pattern is etched while using the P+ poly liner as a protective hard mask.

18. The method of claim 17, wherein the line mask pattern defines a line opening for a conductor, and a contact to support photoresist opening in a mask in the DRAM supports region is wider than the line opening in the line mask, which compensates for possible misalignment when the contact via is patterned and etched in the supports region because the P+ poly liner functions as a hard mask which limits the contact via openings to within the metal line mask pattern such that the contact via is self aligned to the metal line mask pattern.

19. A semiconductor device which uses metal contact studs while preventing shorts from metal contacts to N-well active areas, wherein each contact via for each metal contact has an adjacent P+ outdiffusion region forming a reverse biased PN junction to the active area which is self aligning to an interface between the contact via and the active area to prevent a short short between the contact via and the active area.

20. The semiconductor device of claim 19, further including a P+ doped poly liner formed on sidewalls of each contact via.

* * * * *